US012662736B2

(12) United States Patent
Han et al.

(10) Patent No.: US 12,662,736 B2
(45) Date of Patent: Jun. 23, 2026

(54) MANUFACTURING METHOD FOR GRAPHENE FILM

(71) Applicant: KOREA INSTITUTE OF SCIENCE AND TECHNOLOGY, Seoul (KR)

(72) Inventors: Seung Hee Han, Seoul (KR); Unhyeon Kang, Seoul (KR); Eunbi Jeong, Seoul (KR); Soeun Ahn, Seoul (KR); Kyoung Ho Jeon, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 27 days.

(21) Appl. No.: 18/121,169

(22) Filed: Mar. 14, 2023

(65) Prior Publication Data

US 2024/0175136 A1 May 30, 2024

(30) Foreign Application Priority Data

Nov. 30, 2022    (KR) ........................ 10-2022-0164568

(51) Int. Cl.
| | |
|---|---|
| *C23C 16/505* | (2006.01) |
| *C23C 16/26* | (2006.01) |
| *H01J 37/32* | (2006.01) |

(52) U.S. Cl.
CPC ........... *C23C 16/505* (2013.01); *C23C 16/26* (2013.01); *H01J 37/32082* (2013.01); *H01J 37/32816* (2013.01); *H01J 2237/332* (2013.01)

(58) Field of Classification Search
CPC .... H01L 29/1606; C30B 25/18; C23C 16/505
See application file for complete search history.

(56) References Cited

U.S. PATENT DOCUMENTS

2015/0050482 A1* 2/2015 Ruoff ...................... C30B 25/18
428/220

FOREIGN PATENT DOCUMENTS

| | | | | |
|---|---|---|---|---|
| JP | 2014-037340 | 2/2014 | | |
| JP | 2014037340 A | * 2/2014 | ............. | C01B 31/02 |
| JP | 2017-222538 | 12/2017 | | |
| KR | 10-2013-0126111 | 11/2013 | | |
| KR | 10-2017-0003670 | 1/2017 | | |

OTHER PUBLICATIONS

Munoz et al., Low temperature metal free growth of graphene on insulating substrates by plasma assisted chemical vapor deposition, 2D Materials, vol. 4, 2017, pp. 1-13 (Year: 2017).*
Jong-Bae Park et al., "Plasma electron annealing method for recrystallization of a-Si thin films", Thin Solid Films 622 (2017), pp. 111-114, Dec. 19, 2016.

* cited by examiner

*Primary Examiner* — Dah-Wei D. Yuan
*Assistant Examiner* — Andrew J Bowman
(74) *Attorney, Agent, or Firm* — LEX IP MEISTER, PLLC

(57) ABSTRACT

An exemplary embodiment of the present invention can provide a method of manufacturing a graphene film, including preparing a substrate including a carbon layer in a chamber, and forming a graphene layer by forming plasma in the chamber and applying a positive voltage pulse to the substrate.

5 Claims, 9 Drawing Sheets

$I_D / I_G$ Value Raman Mapping
Scan Size : 20 μm x 20 μm $I_{2D} / I_G$ Value Raman Mapping
Scan Size : 20 μm x 20 μm

MANUFACTURING METHOD FOR GRAPHENE FILM

CROSS-REFERENCE TO RELATED APPLICATION

This application claims priority to and the benefit of Korean Patent Application No. 10-2022-0164568 filed in the Korean Intellectual Property Office on Nov. 30, 2022, the entire contents of which are incorporated herein by reference.

BACKGROUND OF THE INVENTION

(a) Field of the Invention

Exemplary embodiments of the present invention relate to a method of manufacturing a graphene film, and specifically, to a method of manufacturing a graphene film having excellent uniformity at a temperature of 800° C. or lower.

(b) Description of the Related Art

Graphene, which is a two-dimensional material with a honeycomb lattice structure, allows 1,000 times more current to flow and 10 times less heat to be generated than existing conductive wires of copper (Cu), and has thermal conductivity two times or more than that of diamond. In addition, single-layer graphene experimentally has a visible light transmittance of 97.7%, has strength 200 times stronger than iron of the same thickness, and is a material that can shield almost all gases except hydrogen gas because of its high density. Therefore, graphene is attracting attention as a next-generation material due to its electrical, optical, and mechanical characteristics in semiconductors and various fields.

Representative methods of manufacturing graphene include mechanical exfoliation, Hummer's Methods, chemical vapor deposition, and epitaxial growth on a SiC substrate. Among them, chemical vapor deposition (CVD) is a representative manufacturing method, in view of a quality, mass productivity, etc. of graphene produced. However, according to the CVD method, a high process temperature of 1000° C. or higher is required. Also, it is difficult to manufacture high-quality graphene due to strict conditions for a metal foil such as copper (Cu) and nickel (Ni) used as a substrate. In addition, a metal material such as nickel (Ni), copper (Cu), platinum (Pt), and aluminum (Al) is necessarily required to be used as a reaction catalyst. Also, during a transfer process of transferring graphene formed on the metal catalyst material to a substrate to be used, deterioration of graphene quality due to wrinkle, contamination, crack, stress applied to the film and the like is inevitably accompanied.

Therefore, there is a need for a method of manufacturing a graphene film that can be easily performed, can solve the problems described above and can guarantee excellent quality of a graphene film.

The above information disclosed in this Background section is only for enhancement of understanding of the background of the invention, and therefore it may contain information that does not form the prior art that is already known in this country to a person of ordinary skill in the art.

SUMMARY OF THE INVENTION

The present invention has been made in an effort to provide a method of manufacturing a graphene film by which a uniform graphene layer is formed.

An exemplary embodiment of the present invention provides a method of manufacturing a graphene film including preparing a substrate including a carbon layer in a chamber, and forming a graphene layer by forming plasma in the chamber and applying a positive voltage pulse to the substrate.

In the forming of a graphene layer by forming plasma in the chamber and applying a positive voltage pulse to the substrate, the substrate may be maintained at a temperature ranging from 400° C. to 800° C.

The forming of plasma in the chamber may be performed at a degree of vacuum ranging from 1 mTorr to 100 mTorr.

In the forming of a graphene layer by forming plasma in the chamber and applying a positive voltage pulse to the substrate, electrical power may be applied at a frequency of 1 kHz to 10 KHz and a duty cycle ranging from 0.5% to 60%, and a positive voltage pulse voltage ranging from 200 V to 2 kV may be applied to the substrate. In addition, a frequency of the positive voltage pulse may range from 1 kHz to 20 kHz, and a duty cycle of the positive voltage pulse may range from 0.5% to 60%.

Meanwhile, the forming of plasma in the chamber may be performed in an inert gas atmosphere, and the inert gas may be one or more selected from hydrogen ($H_2$), helium (He), neon (Ne), or argon (Ar).

The preparing of a substrate including a carbon layer in the chamber may include arranging a sample plate in the chamber and forming a carbon layer on an upper surface of the sample plate, in which the sample plate may include one or more selected from silicon (Si), silicon oxide ($SiO_2$), silicon carbide (SiC) or silicon nitride ($Si_3N_4$).

The step of forming a graphene layer by forming plasma in the chamber and applying a positive voltage pulse to the substrate may be one selected from forming plasma in the chamber and then applying a positive voltage pulse to the substrate, applying a positive voltage pulse to the substrate and then forming plasma in the chamber or forming plasma in the chamber and applying a positive voltage pulse to the substrate at the same time.

According to the method of manufacturing a graphene film of the exemplary embodiment of the present invention, it is possible to manufacture a graphene film having a graphene layer formed thereon having excellent surface uniformity.

According to the method of manufacturing a graphene film of the exemplary embodiment of the present invention, there is an advantage in that the production cost can be reduced by lowering the operating temperature.

DETAILED DESCRIPTION OF THE EMBODIMENTS

In the specification of the present invention, terms such as first, second, and third are used for describing various parts, components, regions, layers, and/or sections, but are not limited thereto. These terms are used only to discriminate one part, one component, region, layer or section from another part, component, region, layer or section. Therefore, a first part, component, region, layer or section described below may be referred to as a second part, component, region, layer or section without departing from the scope of the present invention.

The technical terms used herein are set forth only to mention specific exemplary embodiments and are not intended to limit the present invention. As used herein, the singular forms "a", "an" and "the" are intended to include the plural forms as well, unless the context clearly indicates otherwise. In the present specification, the term "including" is intended to embody specific characteristics, regions, integers, steps, operations, elements and/or components, but is not intended to exclude presence or addition of other characteristics, regions, integers, steps, operations, elements, and/or components.

When a part is referred to as being "above" or "on" another part, it may be directly above or on the other part or an intervening part may also be present. In contrast, when a part is referred to as being "directly above or on" another part, there is no intervening part present.

Unless otherwise defined, all terms including technical and scientific terms used herein have the same meanings as commonly understood by one skilled in the art to which the present invention belongs. Terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, an exemplary embodiment of the present invention will be described in detail. However, the exemplary embodiment is only provided by way of example, and the present invention is not limited thereto, but is defined by the scope of the claims described later.

Figure 1:
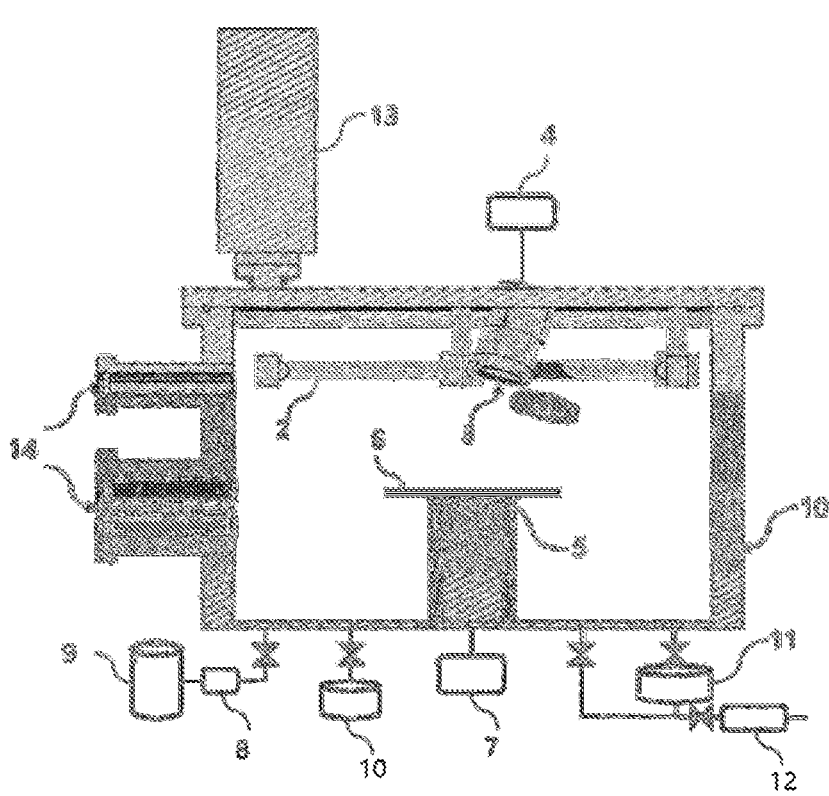
FIG. 1 is a schematic diagram of a graphene film manufacturing apparatus according to an exemplary embodiment of the present invention.

FIG. 1 is a schematic diagram of a graphene film manufacturing apparatus according to an exemplary embodiment of the present invention.

Referring to FIG. 1, a graphene film manufacturing apparatus according to an exemplary embodiment of the present invention includes a chamber 10 capable of providing a space and a condition for manufacturing a graphene film by mounting a substrate therein and forming plasma, a sample table 5 located in the center of the chamber 10, an RF antenna 2 capable of generating plasma, a sputter gun 3 capable of forming a carbon layer on a surface of a sample plate 6 arranged on the sample table 5, a view port 14 positioned penetrating through one side wall of the chamber 10 to observe an inside of the chamber 10, an RF electrical power supply device 13 configured to supply electrical power to the RF antenna 2, and a power supply device 4 configured to supply electrical power to the sputter gun 3. In addition, the graphene film manufacturing apparatus may include a process gas supply unit 9 and a gas flowmeter 8 for supplying a process gas for forming plasma in the chamber 10, a high-vacuum pump 11 and a low-vacuum pump 12 for creating a vacuum condition inside the chamber 10, a vacuum gauge 10 configured to measure a degree of vacuum inside the chamber 10, and a power supply device 7 for applying a positive voltage pulse to the sample table 5.

In an exemplary embodiment of the present invention, a method of manufacturing a graphene film using the graphene film manufacturing apparatus may be provided. The method of manufacturing a graphene film may include steps of preparing a substrate including a carbon layer in a chamber, and forming a graphene layer by forming plasma in the chamber and applying a positive voltage pulse to the substrate.

In the step of preparing a substrate including a carbon layer in the chamber, the substrate including the carbon layer may be arranged on the sample table 5 of the graphene film manufacturing apparatus so that the carbon layer is exposed upward. Alternatively, the substrate may be prepared by arranging a sample plate 6 on the sample table 5 and forming a carbon layer on an upper surface of the sample plate 6 by using the sputter gun 3. At this time, the sample plate may include one or more selected from silicon (Si), silicon oxide ($SiO_2$), silicon carbide (SiC) or silicon nitride ($Si_3N_4$), and is not particularly limited. After arranging the sample plate 6 on the sample table 5, the inside of the chamber 10 is made to be a high-vacuum state. Then, an inert gas is injected and a DC voltage is applied to a high-purity carbon target at a degree of vacuum of about 1 mTorr, so that a carbon layer is formed on the sample by using the sputter gun 3. As a result, a substrate including the carbon layer may be prepared.

After the substrate including the carbon layer is prepared, the inside of the chamber 10 may be formed to be a high vacuum state, and then a pressure inside the chamber 10 may be adjusted to a process pressure ranging from 1 mTorr to 100 mTorr by injecting an inert gas. Then, plasma may be generated by applying electrical power to the RF antenna 2. In this case, plasma may be generated by applying electrical power of about 500 W to 5 KW at a frequency of 1 kHz to 10 KHz and at a duty cycle ranging from 0.5% to 60%.

Meanwhile, the inert gas may be one or more selected from hydrogen ($H_2$), helium (He), neon (Ne), or argon (Ar).

Subsequently, a positive voltage pulse may be applied to the substrate. Applying the positive voltage pulse to the substrate may be performed by applying the positive voltage pulse to the sample table 5. Specifically, a positive voltage pulse voltage ranging from 200 V to 2 kV may be applied with a positive voltage pulse ranging from 1 kHz to 20 KHz and a duty cycle ranging from 0.5% to 60%. In addition, the positive voltage pulse may be applied to the substrate for 10 minutes to 60 minutes. In this case, the temperature of the substrate may be maintained at 600° C. or lower, and specifically, a temperature ranging from 400° C. to 600° C.

Meanwhile, in an exemplary embodiment of the present invention, the step of generating the plasma and the step of applying the positive voltage pulse to the substrate may not be clearly distinguished regarding the order thereof. That is, the positive voltage pulse may be applied to the substrate after generating the plasma, the plasma may be generated after the positive voltage pulse is applied to the substrate, or the plasma generation and the applying of the positive voltage pulse to the substrate may be simultaneously performed.

A graphene film may be manufactured by generating the plasma and applying the positive voltage pulse to the substrate to convert the carbon layer into a graphene layer.

In addition, the graphene layer may have an average roughness Ra value ranging from 0.1 to 0.5 nm, and an $I_{2D}/I_G$ value ranging from 0.15 to 2.0, and an $I_D/I_G$ value ranging from 0.1 to 2.2 according to Raman spectra. Further, a sheet resistance of the graphene layer may be 1 MΩ/□ or less.

Below, preferred Examples of the present invention and Comparative Examples will be described. However, the following Examples are only preferred examples of the present invention, and the present invention is not limited to the following Examples.

Reference Example 1

A silicon oxide wafer (SiO₂ wafer) in which 1,000 Å thick silicon oxide (SiO₂) was coated on a silicon wafer (Si) was prepared on the sample table in the chamber of the graphene film manufacturing apparatus. In a high-vacuum state, argon (Ar) gas was injected into the vacuum chamber so that the process pressure was 1 mTorr. Then, a carbon layer was deposited on the substrate through a sputtering process of applying a DC voltage of −500 V to a carbon target (thickness ⅛", purity 99.99 wt %), so that a substrate having the carbon layer formed thereon was manufactured.

Example 1

After manufacturing the substrate having the carbon layer formed thereon according to Reference Example 1, the inside of the chamber was made to be a high-vacuum state, and helium (He) gas was injected so that the process pressure became 40 mTorr. Next, plasma was generated by applying electrical power of 1 KW to the RF antenna at a frequency of 10 KHz and a duty cycle of 50%.

After generating the plasma, a voltage of 600V was applied to the substrate for 20 minutes, and the substrate temperature was maintained at 600° C. to manufacture a graphene film.

Example 2

A graphene film was manufactured in the same manner as in Example 1, except that after generating the plasma, a voltage of 1 kV was applied to the substrate for 20 minutes and the substrate temperature was maintained at 400° C.

Example 3

A graphene film was manufactured in the same manner as in Example 1, except that after generating the plasma, a voltage of 600 V was applied to the substrate for 40 minutes and the substrate temperature was maintained at 600° C.

Comparative Example 1

After manufacturing the substrate having the carbon layer formed thereon according to Reference Example 1, the substrate was moved to RTP (Rapid Thermal Process) equipment, in which the substrate was then annealed for 20 minutes at a temperature condition of 650° C. by using a halogen lamp, thereby manufacturing a graphene film.

Comparative Example 2

A graphene film was prepared in the same manner as in Comparative Example 1, except that the substrate having the carbon layer formed thereon was moved to the RTP equipment, in which the substrate was then annealed for 20 minutes at a temperature condition of 400° C. by using the halogen lamp.

Figure 2:
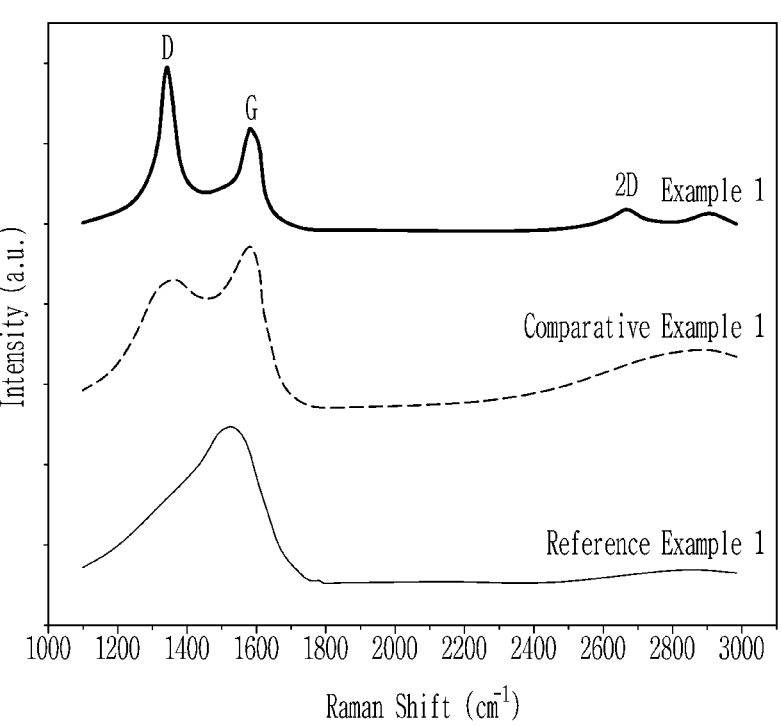
FIG. 2 shows Raman analysis results of graphene films according to Example 1 of the present invention, Comparative Example 1, and Reference Example 1.

FIG. 2 shows Raman analysis results of graphene films according to Example 1 of the present invention, Comparative Example 1, and Reference Example 1.

In the present invention, Raman analysis was performed using an inVia™ Raman Microscope available from Renishaw (UK), and a Nd:YAG laser or a laser was generated at a wavelength of 532 nm.

Referring to FIG. 2, in the case of the graphene film manufactured according to Example 1, it can be confirmed that both the D peak (near 1300 cm⁻¹) and the G peak (near 1580 cm⁻¹) appeared clearly separated, as compared with Comparative Example 1, and the 2D peak (near 2600 cm⁻¹) also appeared clearly. From this, it can be confirmed that the graphene crystals of the graphene film manufactured according to Example 1 were well formed, as compared with Comparative Example 1.

Meanwhile, referring to FIG. 2, the $I_D/I_G$ value according to Example 1 was about 1.6, and the $I_D/I_G$ value according to Comparative Example 1 was about 0.75. In addition, the $I_{2D}/I_G$ value according to Example 1 was about 0.2. That is, in the case of Example 1, it can be confirmed that the graphene layer having excellent quality compared to Comparative Example 1 was formed.

Figure 3:
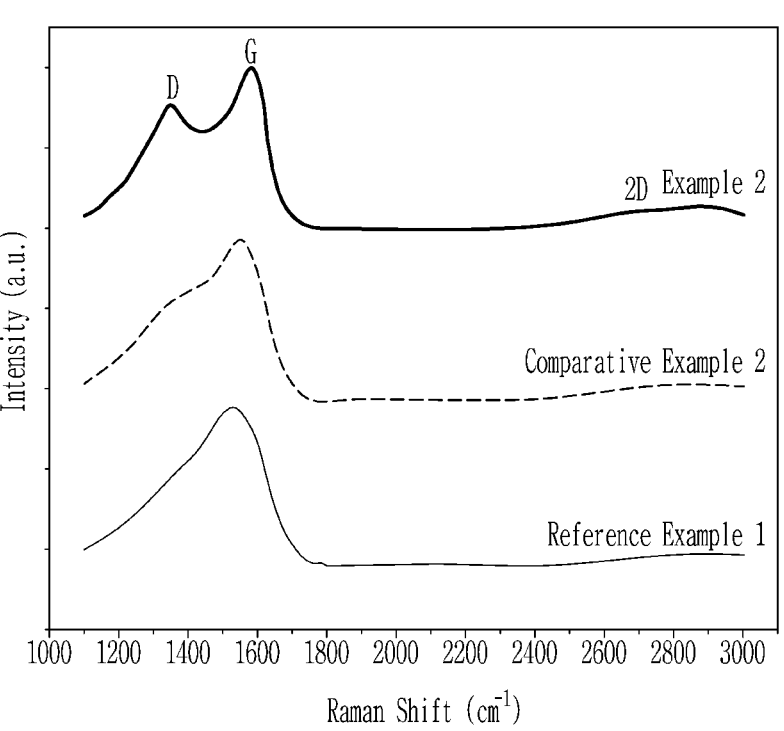
FIG. 3 shows Raman analysis results of graphene films according to Example 2 of the present invention, Comparative Example 2, and Reference Example 1.

FIG. 3 shows Raman analysis results of graphene films according to Example 2 of the present invention, Comparative Example 2, and Reference Example 1.

Referring to FIG. 3, in the case of the graphene film manufactured according to Example 2, it can be confirmed that both the D peak (near 1300 cm⁻¹) and the G peak (near 1580 cm⁻¹) appeared clearly separated, as compared with Comparative Example 2. From this, it can be confirmed that the graphene crystals of the graphene film manufactured according to Example 2 were well formed, as compared with Comparative Example 2.

Figure 4:
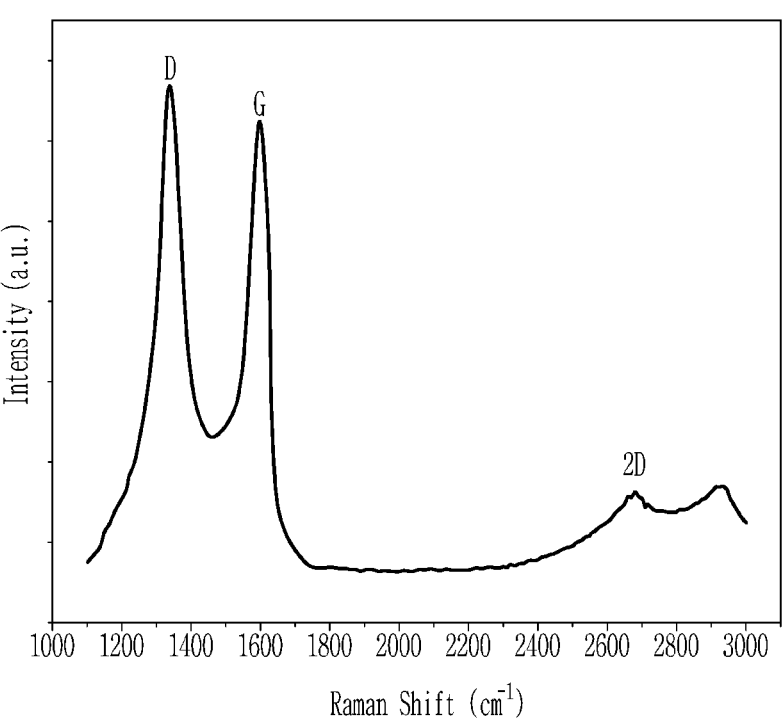
FIG. 4 shows a Raman analysis result of a graphene film according to Example 3 of the present invention.

FIG. 4 shows a Raman analysis result of a graphene film according to Example 3 of the present invention.

Referring to FIG. 4, in the case of the graphene film manufactured according to Example 3, it can be confirmed that the D peak (near 1300 cm⁻¹), the G peak (near 1580 cm⁻¹) and the 2D peak (near 2600 cm⁻¹) appeared clearly. Meanwhile, it can be confirmed that an $I_D/I_G$ value was about 1.011, and therefore, a high-quality graphene layer was formed.

Figure 5A:
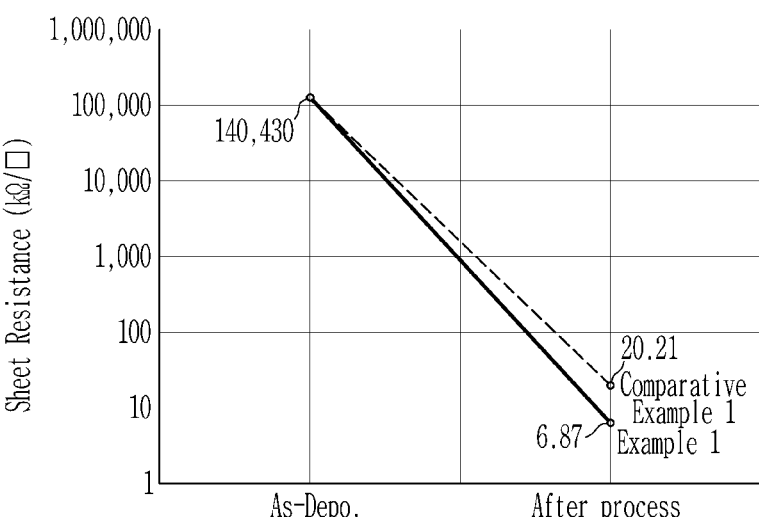
FIGS. 5A and 5B show sheet resistance measurement results of the graphene films according to Examples 1 and 2 of the present invention and Comparative Examples 1 and 2.
Figure 5B:
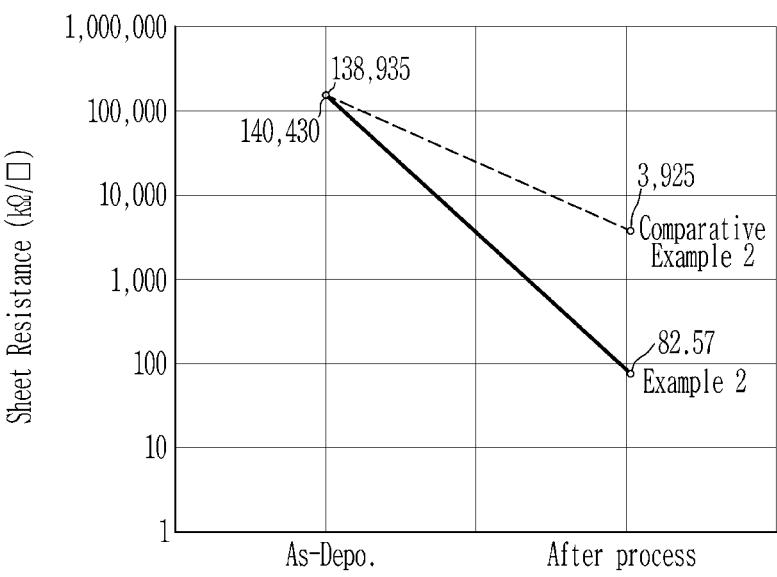

FIG. 5 shows sheet resistance measurement results of the graphene films according to Examples 1 and 2 of the present invention and Comparative Examples 1 and 2.

Specifically, FIG. 5(*a*) shows sheet resistance measurement results of the graphene films according to Example 1 and Comparative Example 1, and FIG. 5(*b*) shows sheet resistance measurement results of the graphene films according to Example 2 and Comparative Example 2.

Referring to FIG. 5(*a*), the sheet resistance of the graphene film manufactured according to Example 1, in which the substrate on which the carbon layer having a sheet resistance of 140,430 kΩ/□ was formed was used, was 6.87 kΩ/□, and the sheet resistance manufactured of the graphene film manufactured according to Comparative Example 1 was 20.21 kΩ/□. Therefore, it can be confirmed that the sheet resistance of the graphene film manufactured according to Example 1 was as low as ⅓ of the sheet resistance of the graphene film manufactured according to Comparative Example 1. From this, it can be confirmed that a graphene layer that was more uniform and of excellent quality compared to Comparative Example 1 was formed in Example 1.

Referring to FIG. 5(*b*), the sheet resistance of the graphene film manufactured according to Example 2, in which the substrate on which the carbon layer having a sheet resistance of 140,430 kΩ/□ was formed was used, was 82.57 kΩ/□, and the sheet resistance of the graphene film manufactured according to Comparative Example 2, in which the substrate on which the carbon layer having a sheet resistance of 138,935 kΩ/□ was formed was used, was 3,925 kΩ/□. From this, it can be confirmed that a graphene layer that was more uniform and of excellent quality compared to Comparative Example 2 was formed in Example 2.

Figure 6A:
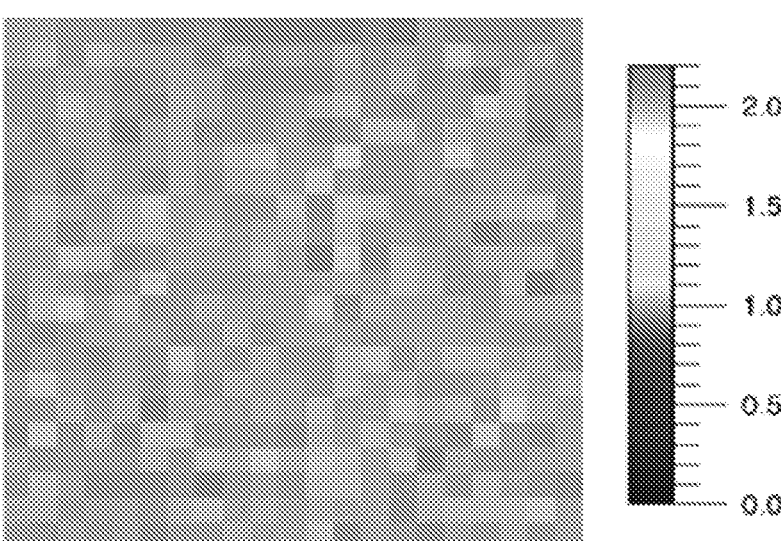
FIGS. 6A and 6B show a Raman mapping analysis result of the graphene film manufactured according to Example 3 of the present invention.
Figure 6B:
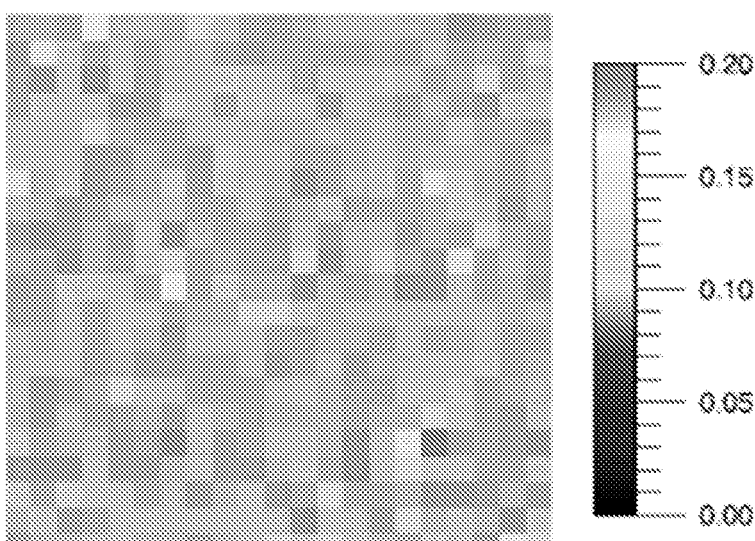

FIG. 6 shows a Raman mapping analysis result of the graphene film manufactured according to Example 3 of the present invention.

Specifically, FIG. 6(*a*) shows the intensity ratio of the D peak (near 1300 cm$^{-1}$) and the G peak (near 1580 cm$^{-1}$) for a scan size of 20 μm×20 μm, and FIG. 6(*b*) shows the intensity ratio of the 2D peak (near 2600 cm$^{-1}$) and the G peak (near 1580 cm$^{-1}$).

Referring to FIG. 6(*a*), it can be confirmed that the $I_D/I_G$ value of the graphene film manufactured according to Example 3 was within the range of 1.0 to 1.2, and referring to FIG. 6(*b*), it can be confirmed that the $I_{2D}/I_G$ value of the graphene film manufactured according to Example 3 was within the range of 0.15 to 0.18.

In addition, it can be confirmed that the $I_D/I_G$ value and the $I_{2D}/I_G$ value showed almost similar values in all regions, and therefore, a graphene layer having a uniform quality was formed according to Example 3.

Figure 7:
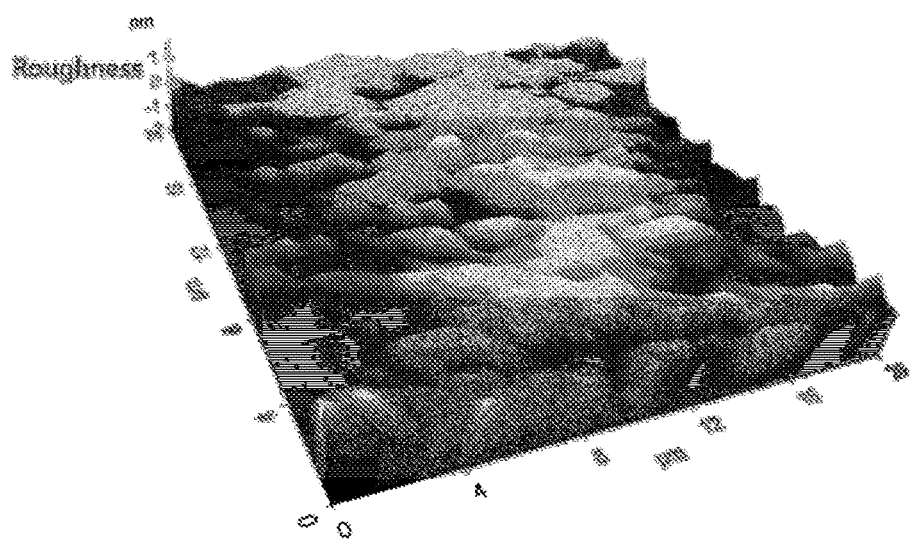
FIG. 7 shows an AFM analysis result of a surface of the graphene film according to Example 3 of the present invention.

FIG. 7 shows an AFM analysis result of a surface of the graphene film according to Example 3 of the present invention.

In the present invention, AFM analysis was performed using the XE-100 model available from Park Systems (Republic of Korea). Specifically, the surface of the graphene thin film was measured in a non-contact mode in which the probe did not directly contact the sample surface, and an area of 20 μm×20 μm was measured. The measured AFM data was edited into a 3D image to obtain Ra values by using software of Park systems.

Referring to FIG. 7, the average roughness (Ra) value of the graphene film manufactured according to Example 3 of the present invention was within the range of 0.1 to 0.5 nm, and the average Ra was about 0.320 nm.

From this, it can be confirmed that the graphene manufactured according to Example 3 of the present invention formed a smooth and uniform surface.

It will be understood by one skilled in the art to which the present invention belongs that the present invention is not limited to the above exemplary embodiments, but can be manufactured in a variety of different forms, and can be implemented in other specific forms without changing the technical spirit or essential features of the present invention. Therefore, the exemplary embodiments described above should be understood as illustrative in all respects and not for purposes of limitation.

What is claimed is:

1. A method of manufacturing a graphene film, the method comprising:
   preparing a silicon oxide wafer substrate comprising a carbon layer in a chamber; and
   forming a graphene layer by forming plasma in the chamber and applying a positive voltage pulse to the substrate,
   wherein:
   in the forming of a graphene layer by forming plasma in the chamber and applying a positive voltage pulse to the substrate, the substrate is maintained at a temperature ranging from 400° C. to 600° C., and
   in the applying of a positive voltage pulse to the substrate, a duty cycle of the positive voltage pulse ranges from 0.5% to 60%,
   wherein the preparing of a substrate comprising a carbon layer in the chamber comprises:
   arranging a sample plate in the chamber, and forming the carbon layer on an upper surface of the sample plate,
   wherein the sample plate is mounted on a sample table in the chamber and the carbon layer is formed on the upper surface of the sample plate by using a sputter gun,
   wherein the forming of plasma in the chamber is performed at a degree of vacuum ranging from 1 m Torr to 100 mTorr, and
   wherein a frequency of the positive voltage pulse ranges from 1 kHz to 10 kHz.

2. The method of claim 1, wherein:
   the positive voltage pulse voltage ranges from 200 V to 2 KV to the substrate.

3. The method of claim 1, wherein:
   the forming of plasma in the chamber
   is performed in an inert gas atmosphere.

4. The method of claim 3, wherein:
   the inert gas is one or more selected from hydrogen (H2), helium (He), neon (Ne) or argon (Ar).

5. The method of claim 1, wherein:
   the forming of a graphene layer by forming plasma in the chamber and applying a positive voltage pulse to the substrate is
   one selected from forming plasma in the chamber and then applying the positive voltage pulse to the substrate, applying the positive voltage pulse to the substrate and then forming plasma in the chamber or forming plasma in the chamber and applying the positive voltage pulse to the substrate at the same time.

* * * * *